United States Patent
Wen et al.

(10) Patent No.: US 10,828,775 B2
(45) Date of Patent: Nov. 10, 2020

(54) METHOD AND SYSTEM FOR AUTOMATIC ROBOT CONTROL POLICY GENERATION VIA CAD-BASED DEEP INVERSE REINFORCEMENT LEARNING

(71) Applicant: Siemens Aktiengesellschaft, Munich (DE)

(72) Inventors: Chengtao Wen, Redwood City, CA (US); Max Fahrenkopf, Palo Alto, CA (US); Juan L. Aparicio Ojea, Berkeley, NJ (US)

(73) Assignee: Siemens Aktiengesellschaft, Munich (DE)

( * ) Notice: Subject to any disclaimer, the term of this patent is extended or adjusted under 35 U.S.C. 154(b) by 286 days.

(21) Appl. No.: 16/119,191

(22) Filed: Aug. 31, 2018

(65) Prior Publication Data
US 2019/0091859 A1 Mar. 28, 2019

Related U.S. Application Data

(60) Provisional application No. 62/563,299, filed on Sep. 26, 2017.

(51) Int. Cl.
| | |
|---|---|
| *B25J 9/16* | (2006.01) |
| *G05B 13/02* | (2006.01) |
| *G06F 30/20* | (2020.01) |

(52) U.S. Cl.
CPC ............ *B25J 9/163* (2013.01); *B25J 9/1671* (2013.01); *G05B 13/029* (2013.01); *G05B 2219/40499* (2013.01); *G06F 30/20* (2020.01)

(58) Field of Classification Search
CPC ........ B25J 9/163; B25J 9/1664; B25J 9/1671; G05B 13/0265; G05B 13/027; G05B 13/028; G05B 13/029; G05B 2219/40499; G05B 2219/39298; G06F 30/20; G06F 30/27
See application file for complete search history.

(56) References Cited

U.S. PATENT DOCUMENTS

2017/0190052 A1* 7/2017 Jaekel .................... B25J 9/1664

OTHER PUBLICATIONS

Englert, et al., "Model-based Imitation Learning by Probabilistic Trajectory Matching", May 2013, IEEE International Conference on Robotics and Automation (ICRA), pp. 1922-1927 (Year: 2013).*

* cited by examiner

*Primary Examiner* — Spencer D Patton (57) ABSTRACT

Systems and methods for automatic generation of robot control policies include a CAD-based simulation engine for simulating CAD-based trajectories for the robot based on cost function parameters, a demonstration module configured to record demonstrative trajectories of the robot, an optimization engine for optimizing a ratio of CAD-based trajectories to demonstrative trajectories based on computation resource limits, a cost learning module for learning cost functions by adjusting the cost function parameters using a minimized divergence between probability distribution of CAD-based trajectories and demonstrative trajectories; and a deep inverse reinforcement learning engine for generating robot control policies based on the learned cost functions.

16 Claims, 4 Drawing Sheets

METHOD AND SYSTEM FOR AUTOMATIC ROBOT CONTROL POLICY GENERATION VIA CAD-BASED DEEP INVERSE REINFORCEMENT LEARNING

CROSS-REFERENCE TO RELATED APPLICATION

This application claims the benefit of U.S. Provisional Application No. 62/563,299, filed on Sep. 26, 2017, the content of which is incorporated herein in its entirety.

TECHNICAL FIELD

This application relates to automation systems. More particularly, this application relates to machine learning and generation of control policies for machine learning of automation systems.

BACKGROUND

Deep Reinforcement Learning (DRL) is a branch of machine learning that balances exploitation of current knowledge and exploration, in order to train an automation agent, such as a robot, various manipulation tasks. DRL is an end-to-end approach that extends the learning process from observation by sensors to action by motors. The automation agent can acquire complex manipulation skills automatically from high-level task specifications. DRL algorithms depend heavily on known cost functions, which serve as the evaluation criteria for the selection of different robot control policies. However, it is often very challenging to define the cost functions in practice. Given complex robotic manipulation tasks, field engineers may have only a very rough idea as to what the cost functions should be, and as to which ones would generate the "desirable" robot behaviors. Oftentimes, one must resort to time-consuming trial-and-error methods to find a good candidate cost function. Such an approach requires significant human intervention, which is error-prone and time-and-cost prohibitive.

Inverse Reinforcement Learning (IRL), or Inverse Optimal Control, is a state-of-art method to learn cost functions directly from a set of expert demonstrations. Apprenticeship Inverse Reinforcement Learning considers learning in a Markov decision process with unknown cost functions, and attempts to recover the unknown cost functions, using the observed expert demonstration of the tasks.

Typically, IRL includes the steps of jogging robots through the desired paths, recording the specific points in robot controllers, and utilizing the recorded points to create movement commands. However, drawbacks of using IRL to generate cost functions include human demonstration generally lacking scalability and heavy reliance on demonstrator skill level. The time required by human demonstration becomes infeasible quickly as the number of demonstration increases for a given size of the demonstrators. In addition, human demonstrators are exposed to a hostile field operation environment, near heavy and powerful industrial robots. Accurately guiding the robots through the desired motions is very difficult, particularly when the workpiece has a complex geometry or the manufacturing processes are complicated. Lastly, production time is lost while robots are being trained.

SUMMARY

Aspects according to embodiments of the present disclosure include methods and systems to automate the parameterization of cost functions of Deep Inverse Reinforcement Learning (DIRL) algorithms in generating robot programs with significantly reduced human interventions. The application of the disclosed DIRL algorithms may be useful in flexible manufacturing and smart logistics, where it may be difficult to express an explicit cost function by balancing different key performance indices.

BRIEF DESCRIPTION OF THE DRAWINGS

Non-limiting and non-exhaustive embodiments of the present embodiments are described with reference to the following FIGURES, wherein like reference numerals refer to like elements throughout the drawings unless otherwise specified.

DETAILED DESCRIPTION

Methods and systems are disclosed for integration of computer aided design (CAD) models and human expert demonstrations to learn cost function parameters, which are fed to a Deep Inverse Reinforcement Learning (DIRL) algorithm to automatically generate robot control policies. CAD software packages may be used to generate a number of candidate inputs (e.g., trajectories or other objective related inputs) of high quality as the training data set for cost function learning. This training data set may be augmented by a low number of expert demonstrations, the number being minimized by an optimization process. Reliance on CAD-based tools for the majority of inputs greatly reduces down time for robots and the physical risks to human demonstrators. An automatic cost learning algorithm may be implemented to identify the parameters of cost functions by minimizing the difference between the probability distribution of CAD-based inputs and demonstration based inputs. Methods and systems disclosed significantly reduce engineering efforts and time in programming a robot to perform complex tasks under dynamic unstructured shop floor conditions.

The disclosed embodiments provide a novel CAD-based DIRL algorithm for automatic robot programming. A conventional DRL approach can generate robot programming from known cost functions by using the robots to explore their environments, and learning the trajectories therefrom. However, defining a cost function that can be optimized effectively and encodes the correct tasks can be challenging in solve real-world robot manipulation problems, especially as the tasks become more intricate, complex, and demanding of precision (e.g., to pour water into a glass). One advantage of the disclosed embodiments is to automate the generation of the cost functions for a DIRL algorithm using an optimized combination of CAD-based models and expert demonstration. An integration of cost function generation and the EARL algorithm is applied to automatically generate robot programming.

Advantages of the proposed system and method are as follows. Programming of robots can be achieved in reduced time, cost and engineering efforts compared with conventional methods. By including contribution from both CAD-based design models and expert demonstration, double safety guarantees can be achieved. Development of higher-quality cost functions translates to robots learning manipulative tasks having higher generalization capability.

Figure 1:
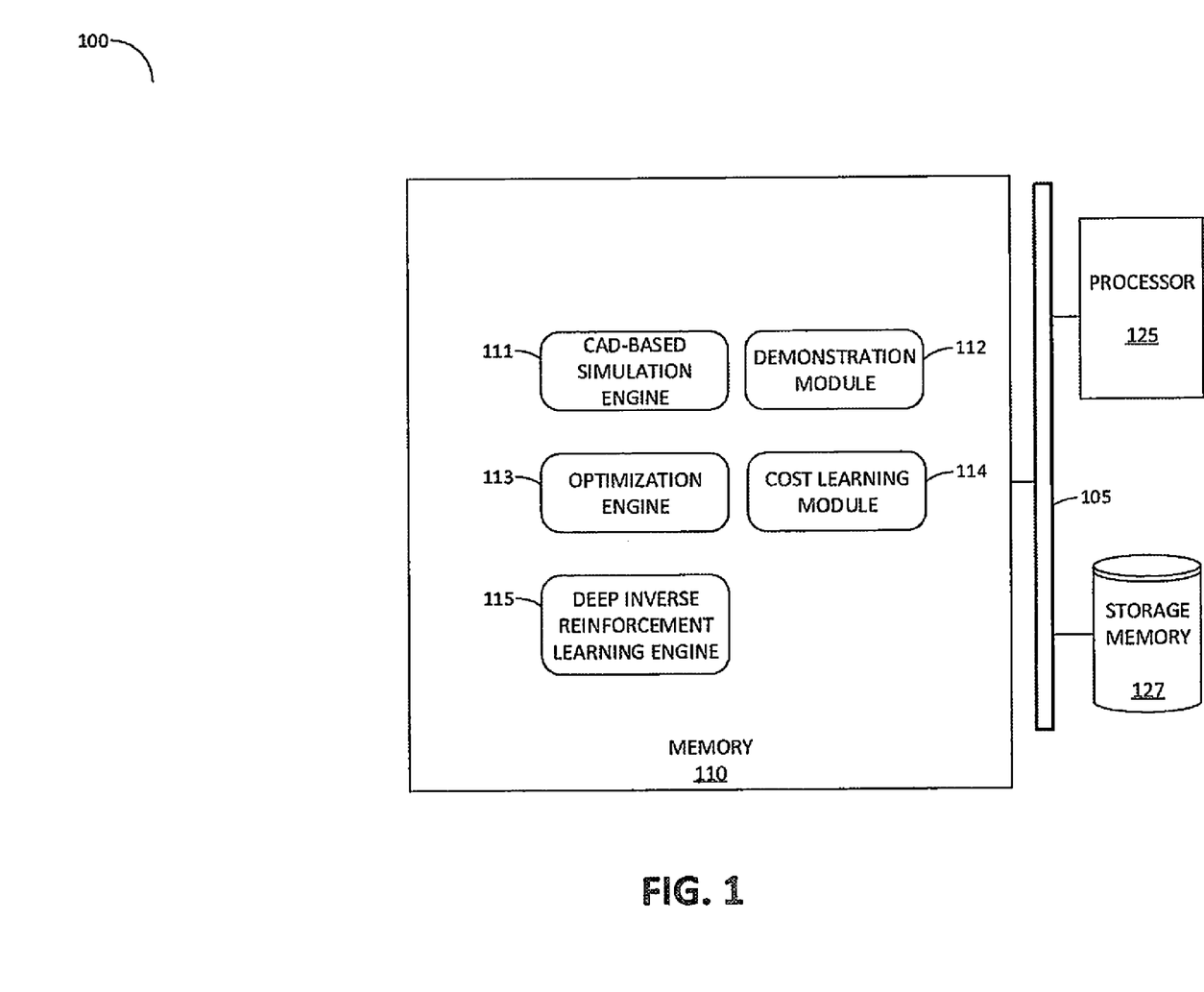
FIG. 1 shows a block diagram for an example of a modular system to generate robot programming in accordance with one or more embodiments of the disclosure.

FIG. 1 shows a block diagram for an example of a modular system to generate robotic trajectories in accordance with one or more embodiments of the disclosure. A system 100 may include a processor 125 to execute modular algorithms stored in memory 110, such as a CAD-based simulation engine 111, a demonstration module 112, an optimization engine 113, a cost learning module 114, and a DIRL engine 115. The processor 125 may store data generated by the modules of memory 110 into storage memory 127 via data bus 105.

The CAD-based simulation engine 111 may receive data from CAD models of a robot stored in storage memory 127. Candidate training data inputs related to robotic manipulations, such as trajectories, may be generated by CAD-based simulation engine 111 using parametrized cost functions. Linear cost functions may be used, which define a cost by a linear combination of feature vectors from manual feature engineering or automatically learned from machine learning algorithms. Neural networks approximate nonlinear functions, and are more representative when compared to a linear cost. Cost functions usually trade-off multiple objectives (e.g., between the accuracy and the resource needed to achieve the required accuracy). An example of a non-linear cost function is given by:

$$J_\theta(x, u) = \sum_{t=1}^{T} w_x \|f_\theta(x_t) - r_t\|^k + w_u \|\Delta u_t\|^k \quad [1]$$

where the first term $\|f_\theta(x_t) - r_t\|$ represents the accuracy (i.e., the difference between the estimated variables and the reference variable $r_t$). The second term is the energy of the manipulated variables $u_t$ needed to drive the state variables $x_t$. The following table lists the variables and descriptions for Equation (1).

| Variables | Description |
|---|---|
| T | Length of trajectory/horizon |
| $x_t$ | The $t^{th}$ state variable, e.g. end-effector pose |
| $u_t$ | The $t^{th}$ manipulated variable, e.g. torque |
| k | 1-, 2-, or infinity norm |
| $r_t$ | The $t^{th}$ reference variable, e.g. target position |
| $f_\theta$ (*) | a deep neural network parameterized by the weights $\theta$ |
| $w_x$ | Weighting coefficient reflecting the relative importance of accuracy |
| $w_u$ | Weighting coefficient penalizing big changes in manipulated variables |

Variables may be defined based on user inputs received from a user interface, including specifications and/or parameters for a robotic task or set of tasks, including the reference values in cost functions (e.g. pick and place coordinates, speed), tuning parameters of cost functions (e.g. length of trajectory and norm used), constraints (e.g. total available CPU time), and geometry (e.g. conveyor parameters, workpiece dimensions), and the like.

The demonstration module 112 may extract information during execution of manual jogging of the robot according to expert demonstration. For example, as the demonstrator guides the robot, trajectories along a grid space may be recorded in space and time domains, and various parameters related to the task to be learned may be derived from the recorded trajectories. The accuracy of demonstration based trajectories may depend on the level of expertise of the demonstration operator and/or the complexity of the geometry of the object or workpiece to be manipulated by the robot. Human expert demonstration implicitly defines the costs to be optimized, which can be inferred from the trajectories.

The optimization engine 113 may determine an optimized ratio of training data generated by the CAD-based simulation engine 111 and the demonstration module 112 according to requirements of the task. The optimization engine 113 seeks the best way to allocate computational resource (e.g., CPU processing time) between expert demonstrations and CAD simulations. The objective is to minimize the risk, which is formulated as a weighted sum of the variances of expected rewards.

$$\min_{n_{dem}, n_{cad}} \frac{\delta_{dem}}{\sqrt{n_{dem}}} + w_{cad} \cdot \frac{\delta_{cad}}{\sqrt{n_{cad}}} \quad [2]$$

$$\text{s.t.} \begin{cases} T_{dem} \cdot n_{dem} + T_{cad} \cdot n_{cad} = T_t \\ n_{dem} \geq n_{min} \\ n_{dem} \leq n_{max} \end{cases}$$

where

| Variables | Description |
|---|---|
| $n_{dem}$ | Number of expert demonstrations |
| $n_{cad}$ | Number of CAD-based simulations |
| $\delta_{dem}$ | Variance of expert demonstrations |
| $\delta_{cad}$ | Variance of CAD-based simulations |
| $T_{dem}$ | Resource needed per expert demonstration |
| $T_{cad}$ | Resource needed per CAD-based simulation |
| $n_{min}$ | Minimum number of expert demonstrations |
| $n_{max}$ | Maximum number of expert demonstrations |
| $T_t$ | Total resource available |

The above constrained optimization can be converted into a single-variable non-constrained optimization problem, as follows:

$$\min_{n_{min} \leq n_{dem} \leq n_{max}} \frac{\delta_{dem}}{\sqrt{n_{dem}}} + w_{cad} \cdot \frac{\delta_{cad}}{\sqrt{\frac{T_t - T_{dem} \cdot n_{dem}}{T_{cad} \cdot n_{cad}}}} \quad [3]$$

The optimal solution can be efficiently calculated by evaluation of the objective functions while varying the $n_{dem}$ from $n_{min}$ to $n_{max}$.

The cost learning module 114 may use the expert demonstration performed by demonstration module 112 to learn the parameters of cost functions. For example, the cost learning module 114 may compare probability distributions of the demonstration trajectories $P(\tau_{dem})$ to that of the CAD-based trajectories $P(\tau_{cad})$, and determine adjustments to parameters to satisfy process requirements. Mathematically, this process is formulated as an optimization problem as follows:

$$\min_{\theta, w_x, w_u} D_{KL}(P(\tau_{cad}) \| P(\tau_{dem})) \qquad [4]$$

$$\text{s.t.: } \tau_{cad} = f(J_\theta(x, u))$$

where $D_{KL}(\bullet)$ denotes the Kullback-Leibler divergence, which measures how different the probability distributions $P(\tau_{cad})$ and $P(\tau_{dem})$ are. The probability distributions of CAD-based trajectories $P(\tau_{cad})$ are implicitly specified by the cost function $J_\theta(x,u)$ with given CAD models. The cost learning module 114 executes an optimization solver that automatically adjusts the parameters $\theta$, $w_x$, $w_u$, so that $D_{KL}(P(\tau_{cad}) \| P(\tau_{dem}))$ is minimized.

The DIRL engine 115 takes the learned cost functions as its inputs, which are fed into a DIRL algorithm. The DIRL engine 115 may use the cost function inputs as evaluation criteria for the selection of different robot control policies.

Learning nonlinear cost functions from user demonstrations and learning a policy to achieve the goal as described by the cost function can be performed iteratively or simultaneously. The joint optimization of cost function and control policy generates local optimal solutions of higher quality, when compared to algorithms that optimize cost function and policy independently.

Figure 2:
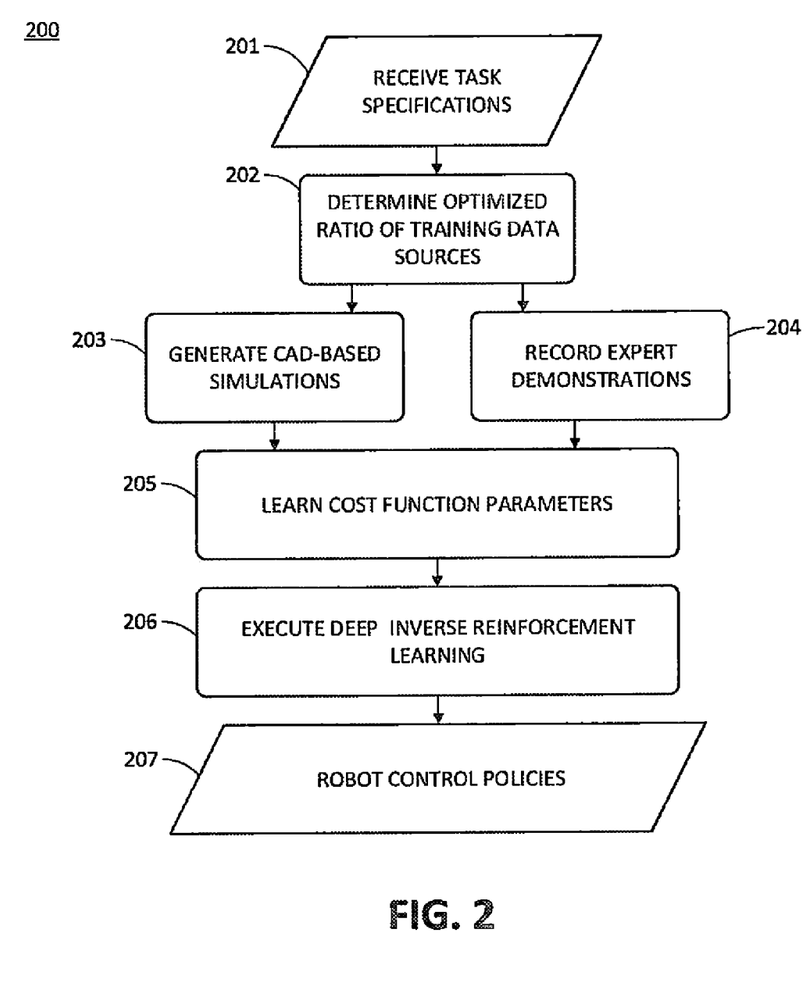
FIG. 2 shows a flow diagram for an example of a method to generate robot programming in accordance with one or more embodiments of the disclosure.

FIG. 2 shows a flow diagram for an example of a method to generate robotic trajectories in accordance with one or more embodiments of the disclosure. A method 200 may be executed by processor 125 using algorithm modules 111, 112, 113, 114, and 115 in memory 110. At 201, task specifications are received. For example, an operator may enter a description of tasks using a user interface, which may include specifications and/or parameters for a robotic task or set of tasks, including the reference values in cost functions (e.g. pick and place coordinates, speed), tuning parameters of cost functions (e.g. length of trajectory and norm used), constraints (e.g. total available CPU time), and geometry (e.g. conveyor parameters, workpiece dimensions), and the like.

At 202, the optimization engine 113 may determine an optimized ratio of source based trajectories to be used as training data, depending on the task requirements. For example, the optimization engine 113 may recognize the task specifications surpassing a threshold for a high complexity task, and determine that the ratio of CAD-based simulations to expert demonstrations should favor the CAD-based simulations, when running the expert demonstration takes much longer time than running CAD-based simulations.

At 203, the CAD-based simulation engine 111 may generate an optimized number of CAD-based simulations, while at 204, the demonstration module 112 may process the results of the manual training of the robotic manipulations.

At 205, the cost function learning module 114 may perform a comparison of trajectories from CAD-based simulations to corresponding trajectories extracted from expert demonstrations, and adjust any cost function parameters used to generate CAD-based trajectories that stray beyond a threshold distance to the corresponding demonstrative trajectory. The adjustment of cost function parameters for CAD-based trajectories is performed by a nonlinear optimizer, which executes an optimization that minimizes the difference between the probability distribution of CAD-based trajectories and that of trajectories from expert demonstration. The parameters of costs functions can be the weights of linear feature vectors, or weights of deep neural networks that serve as nonlinear estimators.

At 206, the DIRL engine 115 receives the learned cost functions as evaluation criteria, and executes a DIRL algorithm to select different robot control policies 207.

Method 200 may include a customization algorithm to tailor the proposed method to the real-world applications of automatic robot programming application. For example, the cost function learning at 205 may impose linear structure in the cost function using manually designed features. In addition, the DIRL engine 115 at 206 can implement a customized DIRL algorithm to take advantage of the favorable structure in cost functions.

Figure 3:
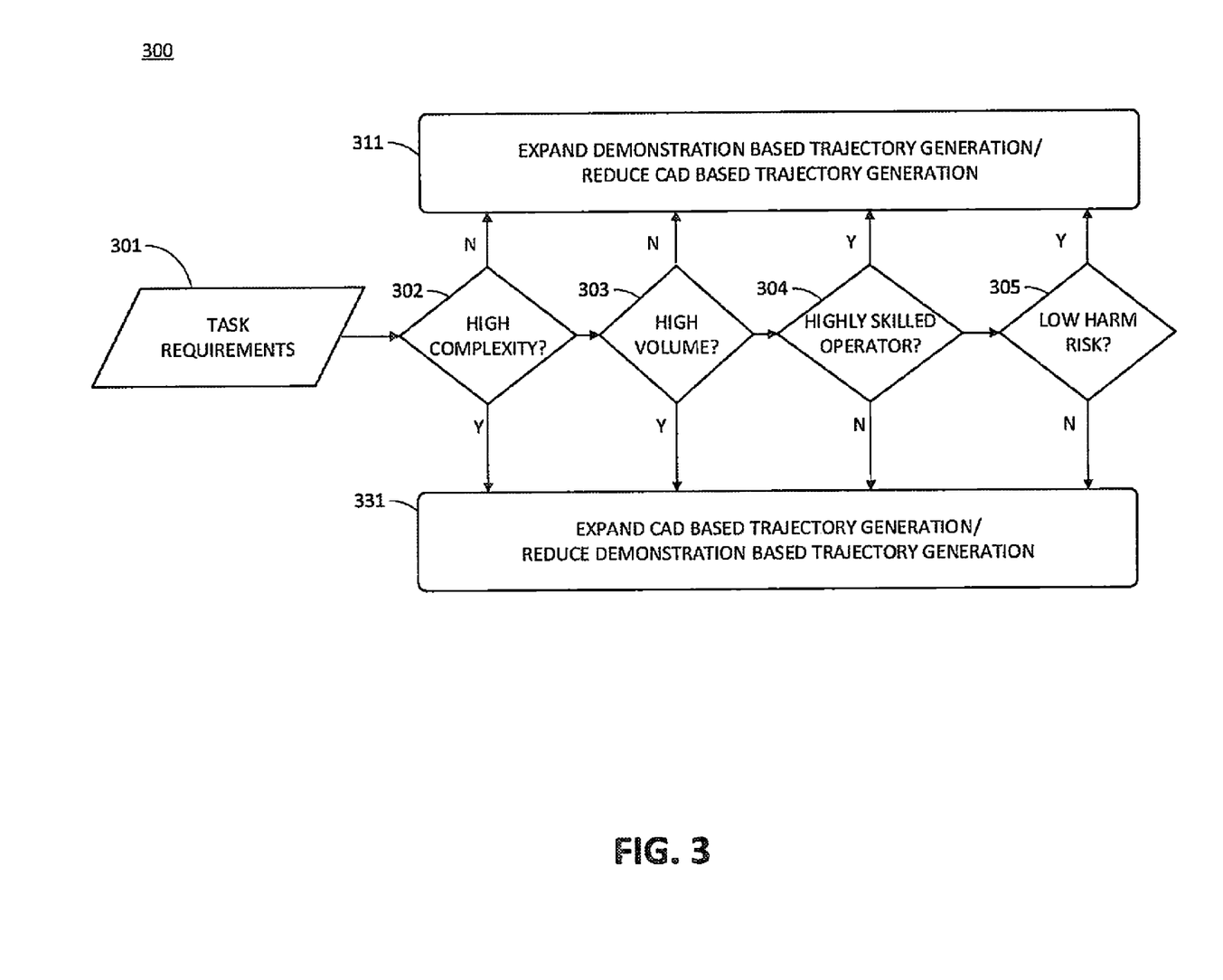
FIG. 3 shows a diagram for an example of an optimization algorithm in accordance with embodiments of the disclosure.

FIG. 3 shows a diagram for an example of an optimization algorithm in accordance with embodiments of the disclosure. A heuristic algorithm 300 may minimize the risks in cost learning. In an embodiment, algorithm 300 is a generalization of Equation (2) into a larger set of problems with unknown variances of expert demonstration and CAD-based simulation. The ratio between CAD-based trajectories and demonstrative trajectories can be adaptively and heuristically tuned to the requirements of the operating domain of the robot (e.g., a particular manufacturing process, an environmental influence, etc.). The optimization algorithm 300 may be executed by the optimization engine 113 to receive task requirements 301 for a given robotic manipulation task, including cost functions related to the task. The optimization algorithm 300 may apply criteria including geometry complexity 302, volume of manipulations 303, skill level of demonstration operator 304, risk of harm to demonstration operator 305, or a combination thereof. For example, the tasks with high complexity geometry 302 and large manipulation volume 303 requires higher ratio of CAD-based trajectories in the training data set. Tasks requiring highly skilled operators 304 and low harm risk 305 (i.e., safe robot) may rely more heavily on demonstration based trajectories. In an embodiment, the optimization algorithm 300 may apply weighted analysis to the criteria 302, 303, 304, 305 for achieving the optimized ratio. In an embodiment, the optimization algorithm 300 may calculate the optimal ratio to minimize the time needed to generate the training data set. For example, rather than generate an overabundance of CAD based trajectories, in a case where demonstration based trajectories are more useful, the optimization algorithm 300 finds the optimum balance and reduces engineering time.

Figure 4:
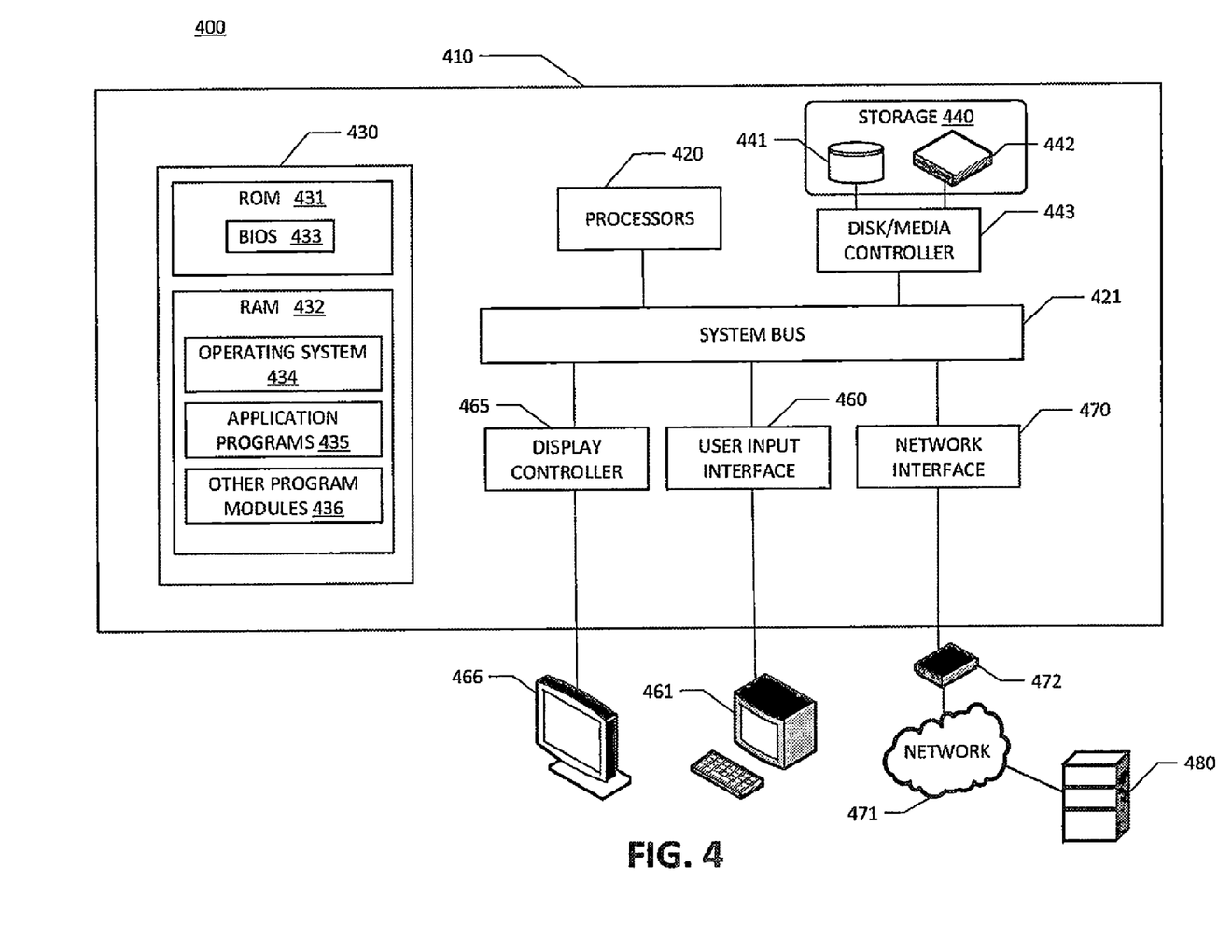
FIG. 4 shows an exemplary computing environment within which embodiments of the disclosure may be implemented.

FIG. 4 shows an exemplary computing environment within which embodiments of the disclosure may be implemented. As shown in FIG. 4, the computer system 410 may include a communication mechanism such as a system bus 421 or other communication mechanism for communicating information within the computer system 410. The computer system 410 further includes one or more processors 420 coupled with the system bus 421 for processing the information.

The processors 420 may include one or more central processing units (CPUs), graphical processing units (GPUs), or any other processor known in the art. More generally, a processor as described herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 420 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor may be capable of supporting any of a variety of instruction sets. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

The system bus 421 may include at least one of a system bus, a memory bus, an address bus, or a message bus, and may permit exchange of information (e.g., data (including computer-executable code), signaling, etc.) between various components of the computer system 410. The system bus 421 may include, without limitation, a memory bus or a memory controller, a peripheral bus, an accelerated graphics port, and so forth. The system bus 421 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnects (PCI) architecture, a PCI-Express architecture, a Personal Computer Memory Card International Association (PCMCIA) architecture, a Universal Serial Bus (USB) architecture, and so forth.

Continuing with reference to FIG. 2, the computer system 410 may also include a system memory 430 coupled to the system bus 421 for storing information and instructions to be executed by processors 420. The system memory 430 may include computer readable storage media in the form of volatile and/or nonvolatile memory, such as read only memory (ROM) 431 and/or random access memory (RAM) 432. The RAM 432 may include other dynamic storage device(s) (e.g., dynamic RAM, static RAM, and synchronous DRAM). The ROM 431 may include other static storage device(s) (e.g., programmable ROM, erasable PROM, and electrically erasable PROM). In addition, the system memory 430 may be used for storing temporary variables or other intermediate information during the execution of instructions by the processors 420. A basic input/output system 433 (BIOS) containing the basic routines that help to transfer information between elements within computer system 410, such as during start-up, may be stored in the ROM 431. RAM 432 may contain data and/or program modules that are immediately accessible to and/or presently being operated on by the processors 420. System memory 430 may additionally include, for example, operating system 434, application programs 435, and other program modules 436.

The operating system 434 may be loaded into the memory 430 and may provide an interface between other application software executing on the computer system 410 and hardware resources of the computer system 410. More specifically, the operating system 434 may include a set of computer-executable instructions for managing hardware resources of the computer system 410 and for providing common services to other application programs (e.g., managing memory allocation among various application programs). In certain example embodiments, the operating system 434 may control execution of one or more of the program modules depicted as being stored in the data storage 440. The operating system 434 may include any operating system now known or which may be developed in the future including, but not limited to, any server operating system, any mainframe operating system, or any other proprietary or non-proprietary operating system.

The application programs 435 may include a set of computer-executable instructions for executing the machine learning and training data generation in accordance with embodiments of the disclosure.

The computer system 410 may also include a disk/media controller 443 coupled to the system bus 421 to control one or more storage devices for storing information and instructions, such as a magnetic hard disk 441 and/or a removable media drive 442 (e.g., floppy disk drive, compact disc drive, tape drive, flash drive, and/or solid state drive). Storage devices 440 may be added to the computer system 410 using an appropriate device interface (e.g., a small computer system interface (SCSI), integrated device electronics (IDE), Universal Serial Bus (USB), or FireWire). Storage devices 441, 442 may be external to the computer system 410, and may be used to store image processing data in accordance with the embodiments of the disclosure.

The computer system 410 may also include a display controller 465 coupled to the system bus 421 to control a display or monitor 466, such as a cathode ray tube (CRT) or liquid crystal display (LCD), for displaying information to a computer user. The computer system includes a user input interface 460 and one or more input devices, such as a user terminal 461, which may include a keyboard, touchscreen, tablet and/or a pointing device, for interacting with a computer user and providing information to the processors 420. The display 466 may provide a touch screen interface which allows input to supplement or replace the communication of direction information and command selections by the user terminal device 461.

The computer system 410 may perform a portion or all of the processing steps of embodiments of the invention in response to the processors 420 executing one or more sequences of one or more instructions contained in a memory, such as the system memory 430. Such instructions may be read into the system memory 430 from another computer readable medium, such as the magnetic hard disk 441 or the removable media drive 442. The magnetic hard disk 441 may contain one or more data stores and data files used by embodiments of the present invention. The data store may include, but are not limited to, databases (e.g., relational, object-oriented, etc.), file systems, flat files, distributed data stores in which data is stored on more than one node of a computer network, peer-to-peer network data stores, or the like. The processors 420 may also be employed in a multi-processing arrangement to execute the one or more sequences of instructions contained in system memory 430. In alternative embodiments, hard-wired circuitry may be used in place of or in combination with software instructions. Thus, embodiments are not limited to any specific combination of hardware circuitry and software.

As stated above, the computer system 410 may include at least one computer readable medium or memory for holding instructions programmed according to embodiments of the invention and for containing data structures, tables, records, or other data described herein. The term "computer readable medium" as used herein refers to any medium that participates in providing instructions to the processors 420 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as magnetic hard disk 441 or removable media drive 442. Non-limiting examples of volatile media include dynamic memory, such as system memory 430. Non-limiting examples of transmission media include coaxial cables, copper wire, and fiber optics, including the wires that make up the system bus 421. Transmission media may also take the form of acoustic or light waves, such as those generated during radio wave and infrared data communications.

Computer readable medium instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, may be implemented by computer readable medium instructions.

The computing environment 400 may further include the computer system 410 operating in a networked environment using logical connections to one or more remote computers, such as remote computing device 480. The network interface 470 may enable communication, for example, with other remote devices 480 or systems and/or the storage devices 441, 442 via the network 471. Remote computing device 480 may be a personal computer (laptop or desktop), a mobile device, a server, a router, a network PC, a peer device or other common network node, and typically includes many or all of the elements described above relative to computer system 410. When used in a networking environment, computer system 410 may include modem 472 for establishing communications over a network 471, such as the Internet. Modem 472 may be connected to system bus 421 via user network interface 470, or via another appropriate mechanism.

Network 471 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 410 and other computers (e.g., remote computing device 480). The network 471 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 471.

It should be appreciated that the program modules, applications, computer executable instructions, code, or the like depicted in FIG. 4 as being stored in the system memory 430 are merely illustrative and not exhaustive and that processing described as being supported by any particular module may alternatively be distributed across multiple modules or performed by a different module. In addition, various program module(s), script(s), plug-in(s), Application Programming Interface(s) (API(s)), or any other suitable computer-executable code hosted locally on the computer system 410, the remote device 480, and/or hosted on other computing device(s) accessible via one or more of the network(s) 471, may be provided to support functionality provided by the program modules, applications, or computer-executable code depicted in FIG. 4 and/or additional or alternate functionality. Further, functionality may be modularized differently such that processing described as being supported collectively by the collection of program modules depicted in FIG. 4 may be performed by a fewer or greater number of modules, or functionality described as being supported by any particular module may be supported, at least in part, by another module. In addition, program modules that support the functionality described herein may form part of one or more applications executable across any number of systems or devices in accordance with any suitable computing model such as, for example, a client-server model, a peer-to-peer model, and so forth. In addition, any of the functionality described as being supported by any of the program modules depicted in FIG. 4 may be implemented, at least partially, in hardware and/or firmware across any number of devices.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters, and/or program codes.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112(f), unless the element is expressly recited using the phrase "means for."

What is claimed is:

1. A system for automatic generation of control policies for a robot, comprising:
   a processor for executing algorithmic modules stored in a memory, wherein the modules include:
   a CAD-based simulation engine for simulating CAD-based trajectories for the robot based on a number of CAD-based simulations using parameterized cost functions;
   a demonstration module configured to record demonstrative trajectories of the robot based on a number of expert demonstrations;
   an optimization engine for optimizing a ratio of CAD-based trajectories to demonstrative trajectories based on variances of the demonstrative trajectories, variances of the CAD-based trajectories, and computation resource limits;
   a cost learning module for generating learned cost functions by adjusting the cost function parameters using a minimized divergence between probability distribution of CAD-based trajectories and demonstrative trajectories; and
   a deep inverse reinforcement learning engine for generating robot control policies based on the learned cost functions.

2. The system of claim 1, wherein the cost functions include a non-linear cost function based on an accuracy of estimated variables against reference variables, and energy of manipulated variables needed to drive state variables.

3. The system of claim 2, wherein values for the reference variables are based on a target position.

4. The system of claim 2, wherein the non-linear cost function is limited by length of trajectory.

5. The system of claim 1, wherein the cost functions include a linear cost function that defines a cost by a linear combination of feature vectors from manual feature engineering.

6. The system of claim 1, wherein the cost functions include a linear cost function that defines a cost by a linear combination of feature vectors automatically learned from machine learning algorithms.

7. The system of claim 1, wherein the optimization engine executes an optimization algorithm for adaptive and heuristic tuning of the ratio using criteria related to task requirements of an operating domain for the robot.

8. The system of claim 7, wherein the criteria include: geometry complexity, volume of manipulations, skill level of expert demonstrations, risk of harm during expert demonstrations, or a combination thereof.

9. A method for automatic generation of control policies for a robot, comprising:
   simulating CAD-based trajectories for the robot based on a number of CAD-based simulations using parameterized cost functions;
   recording demonstrative trajectories of the robot based on a number of expert demonstrations;
   optimizing a ratio of CAD-based trajectories to demonstrative trajectories based on variances of the demonstrative trajectories, variances of the CAD-based trajectories, and computation resource limits;
   generating learned cost functions by adjusting the cost function parameters using a minimized divergence between probability distribution of CAD-based trajectories and demonstrative trajectories; and
   generating robot control policies based on the learned cost functions.

10. The method of claim 9, wherein the cost functions include a non-linear cost function based on an accuracy of estimated variables against reference variables, and energy of manipulated variables needed to drive state variables.

11. The method of claim 10, wherein values for the reference variables are based on a target position.

12. The method of claim 10, wherein the non-linear cost function is limited by length of trajectory.

13. The method of claim 9, wherein the cost functions include a linear cost function that defines a cost by a linear combination of feature vectors from manual feature engineering.

14. The method of claim 9, wherein the cost functions include a linear cost function that defines a cost by a linear combination of feature vectors automatically learned from machine learning algorithms.

15. The method of claim 9, wherein the optimizing includes execution of an optimization algorithm for adaptive and heuristic tuning of the ratio using criteria related to task requirements of an operating domain for the robot.

16. The method of claim 15, wherein the criteria include: geometry complexity, volume of manipulations, skill level of expert demonstrations, risk of harm during expert demonstrations, or a combination thereof.

* * * * *